US006075308A

United States Patent [19]

Date

[11] Patent Number: 6,075,308

[45] Date of Patent: Jun. 13, 2000

[54] VARIABLY SOUND-ABSORBING DEVICE

[75] Inventor: Munehiro Date, Shirokanedai 2-12-24, Minato-ku, Tokyo 108-0071, Japan

[73] Assignees: The Institute of Physical and Chemical Research, Saitama; Munehiro Date, Tokyo, both of Japan

[21] Appl. No.: 09/199,560

[22] Filed: Nov. 25, 1998

[30] Foreign Application Priority Data

Nov. 25, 1997 [JP] Japan .................................... 9-323275

[51] Int. Cl.[7] ...................................................... H01L 41/08

[52] U.S. Cl. ............................................ 310/314; 310/369

[58] Field of Search .................................... 310/314, 318, 310/319, 369

[56] References Cited

U.S. PATENT DOCUMENTS

| | | | |
|---|---|---|---|
| 3,168,623 | 2/1965 | Petermann | 310/369 |
| 4,184,094 | 1/1980 | Kopel | 310/335 |
| 4,888,991 | 12/1989 | Lew | 73/658 |
| 5,054,322 | 10/1991 | Lew | 73/658 |
| 5,414,322 | 5/1995 | Kosinski et al. | 310/366 |
| 5,471,721 | 12/1995 | Haertling | 29/25.35 |

FOREIGN PATENT DOCUMENTS

| | | | |
|---|---|---|---|
| 8-230491 | of 1998 | Japan | H01L 41/08 |

*Primary Examiner*—Thomas M. Dougherty
*Attorney, Agent, or Firm*—Griffin & Szipl, P.C.

[57] ABSTRACT

A variably sound-absorbing device comprises a piezoelectric material 32 the peripheral portion of which is fixed to a frame 31 or the like, at least one pair of electrodes 34 formed on opposite surfaces of the piezoelectric material, and at least one circuit element 36 through which the electrodes are connected to each other. The piezoelectric material 32 is boardlike and curved, and an electrical characteristic of the circuit element 36 (a circuit showing a negative capacitance for example) is variable. The modulus of elasticity (the real number part of the modulus of elasticity) and the loss factor (the imaginary number part of the modulus of elasticity) of the piezoelectric material are thereby varied and the sound-absorbing characteristic is electrically varied to a considerable extent.

2 Claims, 8 Drawing Sheets

Fig. 7c
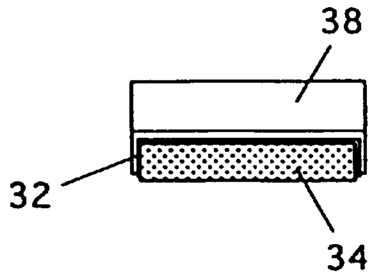
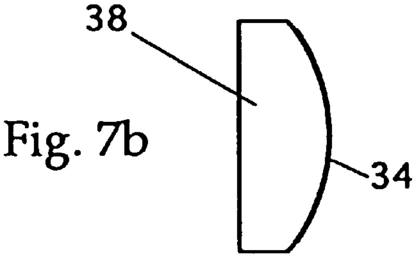
Fig. 7b
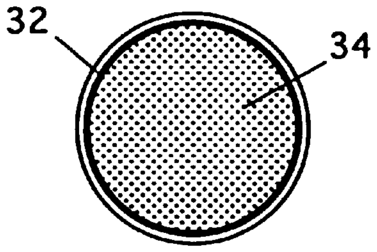
Fig. 7a
Fig. 8
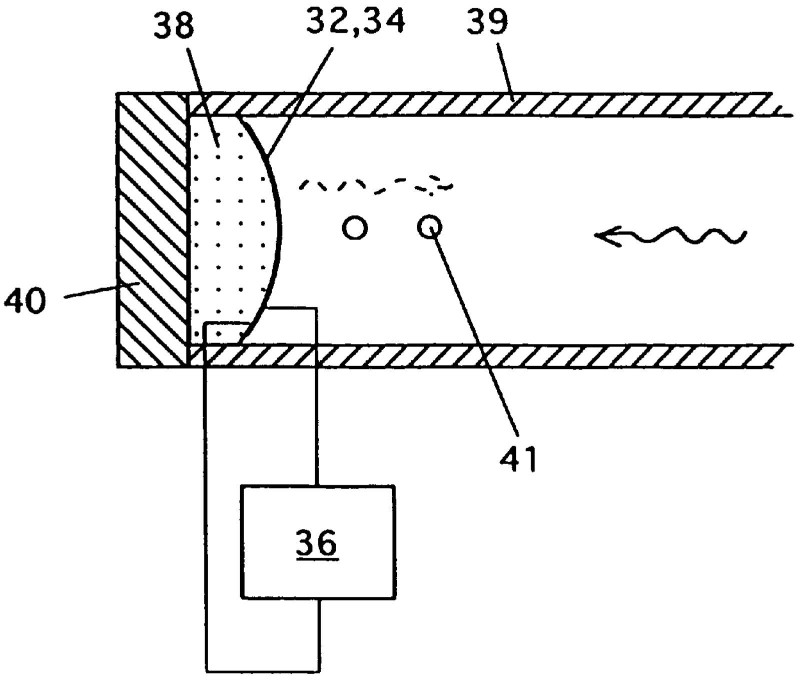

VARIABLY SOUND-ABSORBING DEVICE

BACKGROUND OF THE INVENTION (i) Field of the Invention

The present invention relates to a variably sound-absorbing device which is inserted in the propagation path of elastic waves and the sound-absorbing characteristic of which can be electrically varied.

(ii) Description of the Related Art

A usual sound-absorbing device, for example, a muffler decreases sound power emitted through its outlet in the manner that a lining of sound-absorbing material is provided in a duct or a sound-absorbing material is inserted in the duct to damp propagated sound waves. Such mufflers include resistance type in which a porous layer or a fibrous layer is used as sound-absorbing material and reactive type (or resonance type) in which a honeycomb and a punched plate are combined with each other. The resistance type disperses energy based on the viscosity and the thermal conduction of the medium. The reactive type disperses energy with a loss due to surface friction and momentum according to the motion of the medium.

The sound-absorbing characteristic of such a sound-absorbing device as described above is determined by characteristics of the sound-absorbing material used in the device or the shapes and the dimensions of the honeycomb and the punched plate. It is therefore hard artificially to vary the sound-absorbing characteristic though it varies with a change in environment such as temperature or pressure.

If a sound-absorbing device is inserted in the propagation path of elastic waves and the sound-absorbing characteristic, that is, the reflection and transmission characteristics for elastic waves of the device can be controlled at will, such a device is applicable to audio devices, sound apparatus, soundproof equipment and so on. There are expected any applicable field.

For this purpose, the present inventor et al. had previously invented and filed "A method for controlling the modulus of elasticity of a piezoelectric material" Japanese Patent Application No.8-230491 not yet opened). In this method, a pair of electrodes is formed on a piezoelectric material and circuit elements are connected to the electrodes to vary the modulus of elasticity and the loss factor of the piezoelectric material. Characteristics such as the sound-absorbing characteristic can be controlled with variations of the modulus of elasticity and the loss factor.

SUMMARY OF THE INVENTION

In the present invention, this unopened method is improved to apply to a sound-absorbing device. It is therefore an object of the present invention to provide a variably sound-absorbing device the sound-absorbing characteristic of which can be electrically varied to a considerable extent.

According to the present invention, provided is a variably sound-absorbing device comprising a piezoelectric material the peripheral portion of which is fixed, at least one pair of electrodes formed on opposite surfaces of the piezoelectric material, and at least one circuit element through which the electrodes are connected to each other, the said piezoelectric material being boardlike and curved, the said circuit element having a variable electrical characteristic to vary the modulus of elasticity (the real number part of the modulus of elasticity) and the loss factor (the imaginary number part of the modulus of elasticity) of the piezoelectric material.

In the above construction according to the present invention, the electrodes formed on both surfaces of the piezoelectric material are connected to each other through the circuit element an electrical characteristic of which is variable. The modulus of elasticity (the real number part of the modulus of elasticity) and the loss factor (the imaginary number part of the modulus of elasticity) of the piezoelectric material can be varied thereby. As a result, the elastic loss of the piezoelectric material can be increased and decreased to increase and decrease the absorption of sound by varying the electrical characteristic of the circuit element.

When a boardlike thin piezoelectric material (a film for example) is merely placed perpendicularly to a sound source, however, the whole of the material only vibrates evenly and a good sound-absorbing effect is not expected in case of a light film. When a film is stretched on a frame, an elastic effect is expected at the natural frequency or less of the drum vibration of the film. But it is only by the primary elastic nature of the film and no increase in sound-absorbing characteristic with piezoelectric effect is expected. That is, when the film is oscillated by sound pressure, a tensile force is applied to the film in either of cases that the film is drawn due to decrease in the pressure and the film is pushed due to increase in the pressure. In this case, the variation of the tensile force, which causes a piezoelectric effect, is in proportion to the square of the sound pressure. This means that the piezoelectric effect is decreased in a square manner because of the small amplitude of the sound pressure. For this reason, an expected effect of the piezoelectric connection is not obtained actually.

On the contrary in the above construction according to the present invention, the peripheral portion of the piezoelectric material is fixed and the piezoelectric material is boardlike and curved. When the piezoelectric material is expanded and contracted by sound pressure, a tensile force and a compressive force are alternately applied to the piezoelectric material. In this case, the energy dispersion in the piezoelectric material increases in proportion to the sound energy. As a result, the attenuation of the sound energy can be increased independently of the magnitude of the sound.

According to an aspect of the present invention, the circuit element shows a negative capacitance. By using such a negative capacitance, the modulus of elasticity of the piezoelectric material can be varied from 0 to infinity as described later, and a very broad sound-absorbing characteristic is obtained even in case of a thin electric material.

Other objects and advantageous features of the invention will be apparent from the following description taken in connection with the accompanying drawings.

BRIEF DESCRIPTION OF THE DRAWINGS

FIG. 7*a* is a front view of a part of the variably sound-absorbing device according to the present invention, FIG. 7*b* is a left side view of it and FIG. 7*c* is a top view of it;

FIG. 8 is a view for illustrating an experiment on the variably sound-absorbing device according to the present invention;

DETAILED DESCRIPTION OF THE PREFERRED EMBODIMENT

Hereinafter, a preferred embodiment of the present invention will be described with reference to drawings. In those drawings, common parts are denoted by the same references and repeated descriptions will be omitted.

Figure 1A:
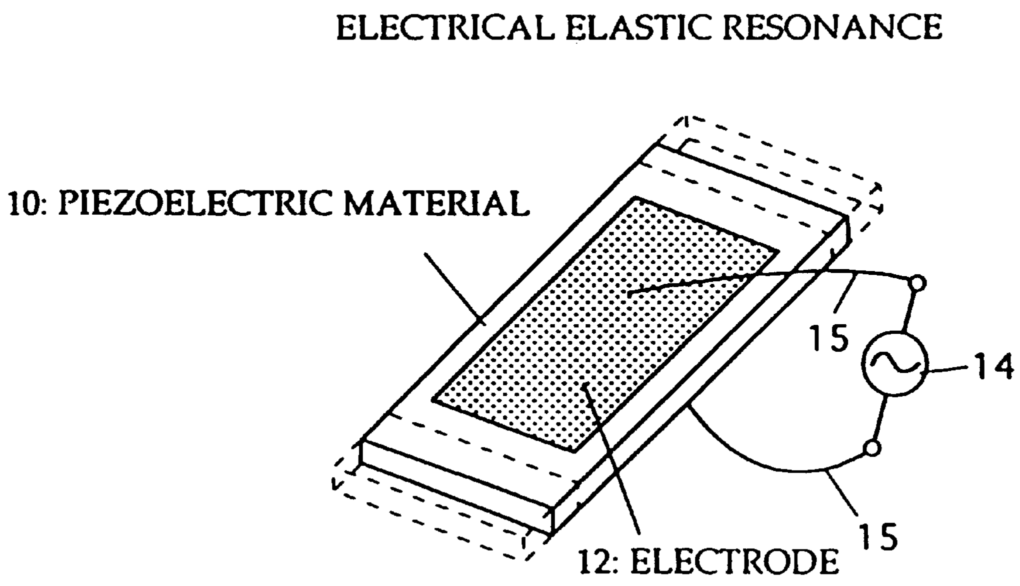
Fig. 1a (prior art)
FIG. 1*a* is a view showing the construction of a piezoelectric material and FIG. 1*b* is a graph showing a characteristic of the piezoelectric material.
Figure 1B:
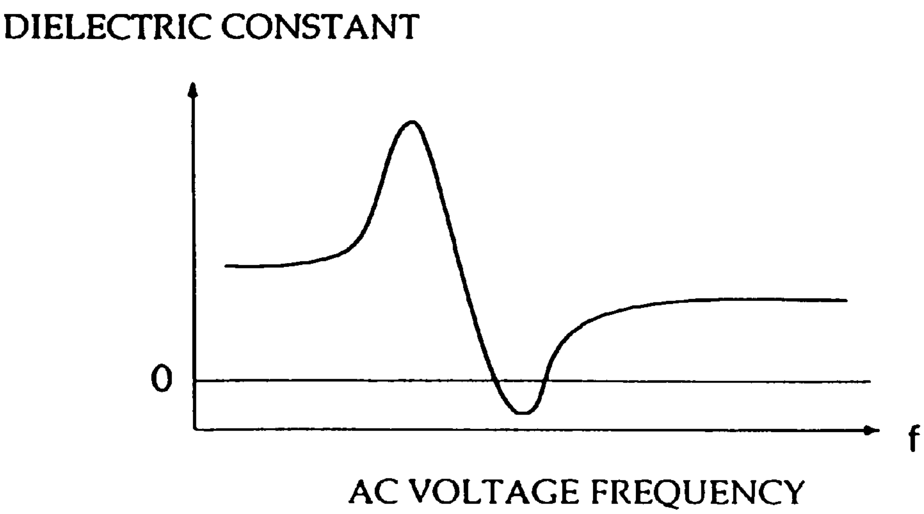
Fig. 1b (prior art)

FIGS. 1*a* and 1*b* are for explaining characteristics of a piezoelectric material. Referring to these drawings, general characteristics of piezoelectric material will be described.

In general, an electromotive force is generated when a force is applied to a piezoelectric material (called "mechano-electric coupling effect") and a further deformation occurs due to the generated electromotive force in addition to the original deformation due to the applied force (called "electromechanical coupling effect").

The additional deformation occurs in the counter direction to the original deformation due to the applied force so the piezoelectric material appears to become harder. The generated electromotive force can be observed as a voltage between a pair of electrodes 12 if the electrodes 12 are formed on the piezoelectricity-generating surfaces of the piezoelectric material 10 as shown in FIG. 1*a*. When these electrodes 12 are short-circuited or electrically disconnected, the magnitude of the electromechanical reaction varies and it is observed as a change in apparent hardness of the piezoelectric material.

But the modulus of elasticity of the piezoelectric material 10 only varies several percents at most by short-circuiting or electrically disconnecting the electrodes 12 formed on the piezoelectricity-generating surfaces of the piezoelectric material. This is because the electromechanical coupling coefficient k, the square of which the effect is in proportion to, is to the extent of 0.2 at most in case of general piezoelectric material.

Such a variation of the modulus of elasticity of several percents at most is only in the extent of error. It was hitherto hard considerably to vary the modulus of elasticity of the piezoelectric material though it was desired that the dynamic range of the variation of the modulus of elasticity be considerably extended to provide a promising device for various kinds of applications.

FIG. 1*b* shows a typical dielectric piezoelectric-resonance dispersion corresponding to a generally observed elastic resonance of a piezoelectric material. The object of this measurement comprises a piezoelectric material 10, a pair of electrodes 12 formed on the piezoelectricity-generating surfaces of the piezoelectric material, and a pair of electric wires 15 respectively connected to the electrodes 12, as shown in FIG. 1*a*. A voltage is applied between the electric wires 15 from an AC power source 14 to observe the dielectric piezoelectric-resonance dispersion. Dotted lines in FIG. 1*a* show typical deformations of the piezoelectric material 10 due to the applied voltage.

In FIG. 1*b*, the horizontal axis represents the frequency of the AC voltage and the vertical axis represents dielectric constant. There is observed a so-called dielectric piezoelectric-resonance dispersion in which the dielectric constant varies with a peak and then becomes negative and then increases as the frequency is increased from a low state.

For the electrodes 12, conductive material such as aluminum or gold is used. As the piezoelectric material 10, usable are a ceramic piezoelectric material such as PZT, a composite material of ceramic powder and rubber, a composite material of ceramic powder and plastic, a ferroelectric high polymer such as poly(vinylidene fluoride) and copolymer of vinylidene fluoride and triphloroethylene, polyamino acid such as polymethyl glutamate, polybenzyl glutamate and polylactate, cellulose or its derivative, wood, a natural high polymer such as collagen, and so on.

Figure 2A:
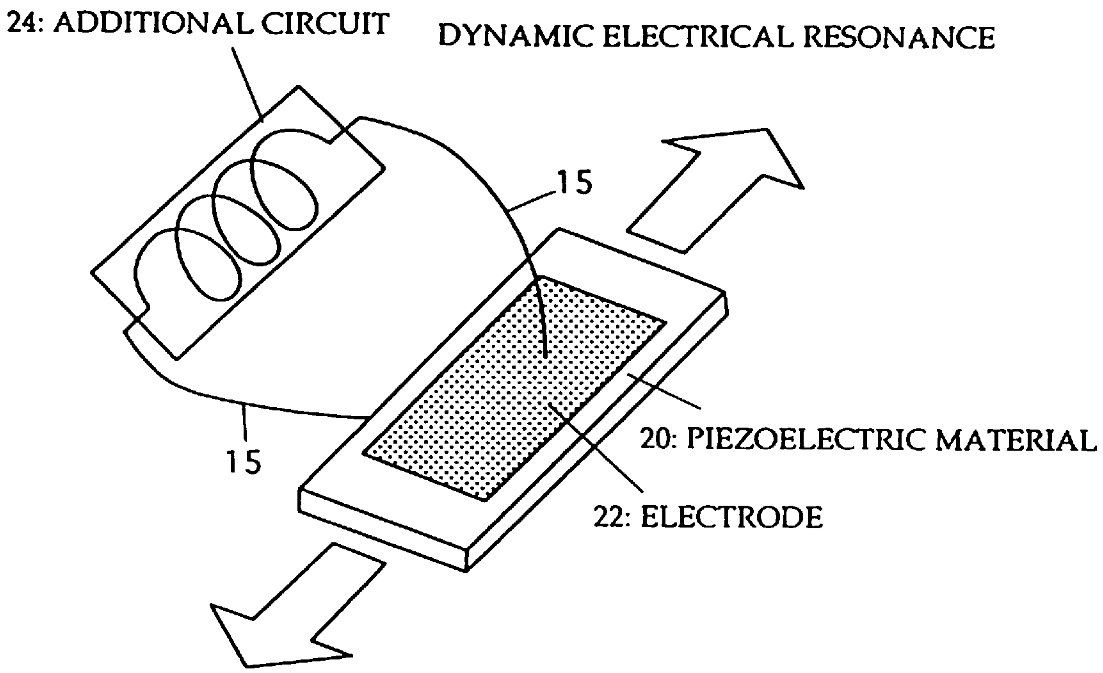
Fig. 2a (prior art)
FIG. 2*a* is a view showing the construction of a variably sound-absorbing device according to the previous invention by the present inventor and FIG. 2*b* is a graph showing a characteristic of the device.
Figure 2B:
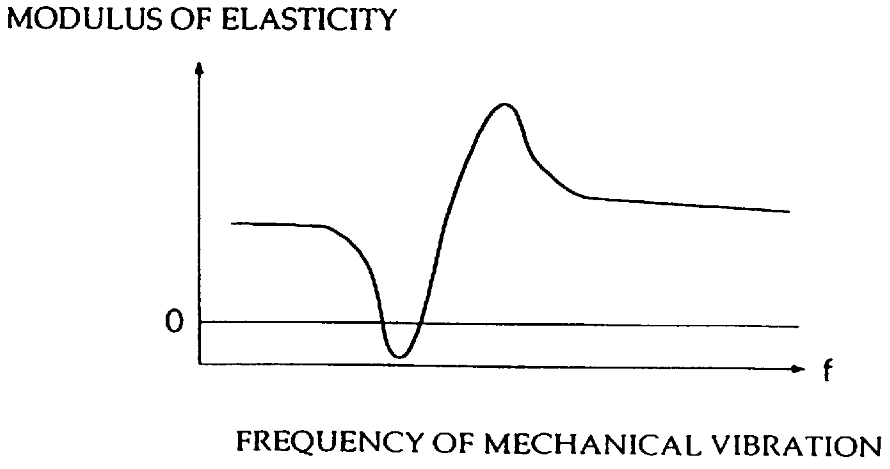
Fig. 2b (prior art)

FIGS. 2*a* and 2*b* are for explaining the previous invention described in the above Japanese Patent Application No.8-230491 (unopened). As shown in FIG. 2*a*, a variably sound-absorbing device according to this previous invention comprise a piezoelectric material 20, a pair of electrodes 22 formed on the piezoelectricity-generating surfaces of the piezoelectric material, and an additional circuit 24 connected to the electrodes 22 through electric wires 15. For the electrodes 22, conductive material such as aluminum or gold is used. As the piezoelectric material 20, the above-described materials are usable. As the additional circuit 24, FIG. 2*a* shows an inductance element, however, a circuit element such as an inductance element, a resistance element, a capacitance element, a negative resistance element and a negative capacitance element may be used solely or a circuit comprising a plurality of circuit elements connected to each other may be used. A circuit having an inductance function, a resistance function, a capacitance function or the like may be used as the additional circuit 24.

In FIG. 2*b*, the horizontal axis represents the frequency of a mechanical vibration and the vertical axis represents the modulus of elasticity. The mechanical vibration is applied and the modulus of elasticity is measured along the longitudinal axis of the piezoelectric material 20 as shown by arrows in FIG. 2*a*. In FIG. 2*b*, there is observed an elastic piezoelectric-resonance dispersion in which the modulus of elasticity becomes negative and then varies with a peak and then decreases gradually as the frequency is increased from a low state. Thus the elastic loss becomes maximun at the position of piezoelectric-resonance dispersion.

Figure 3:
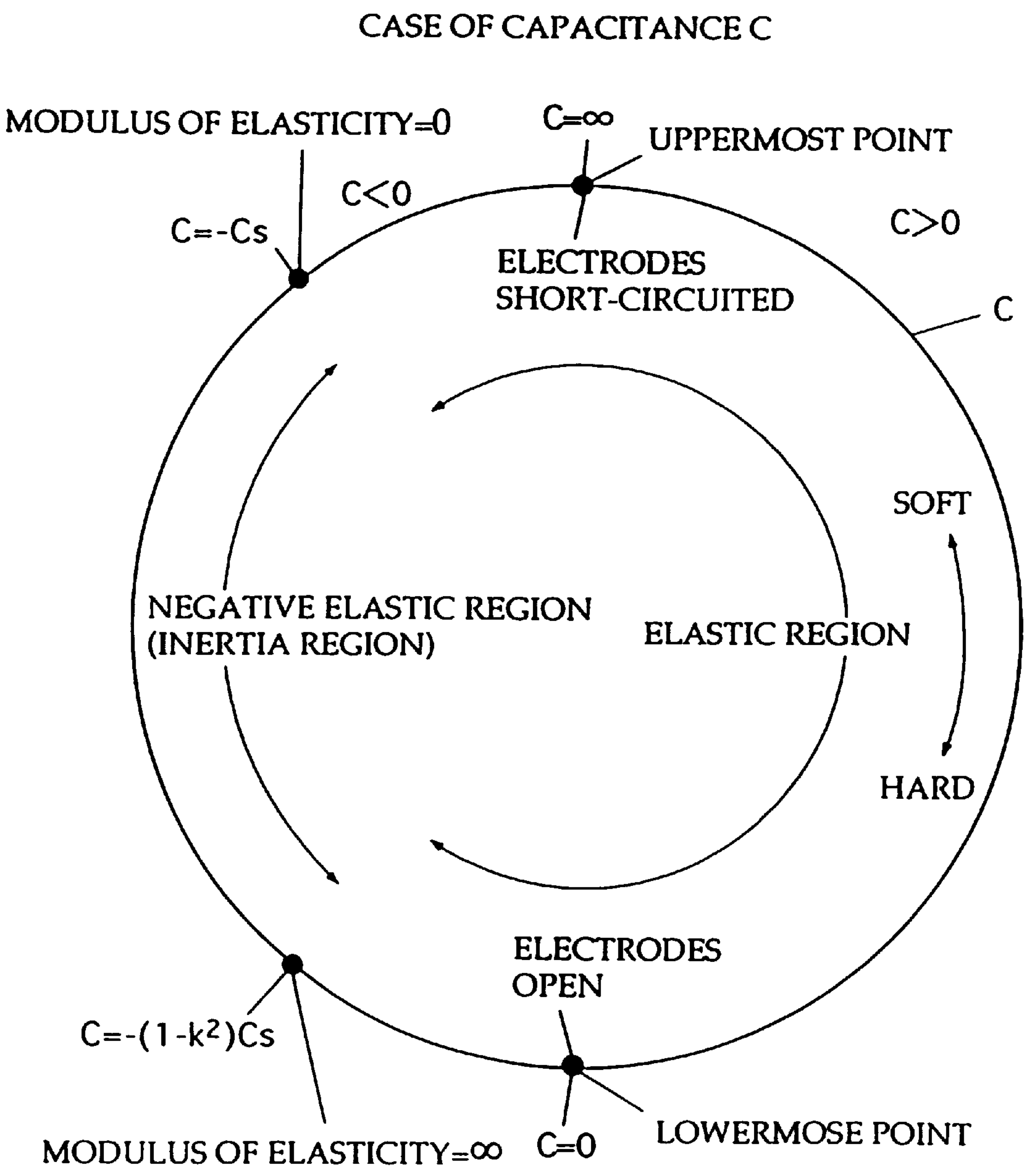
FIG. 3 is a diagram showing the basic principle of the previous invention.

FIG. 3 is for explaining the basic principle of the previous invention. The reason why the modulus of elasticity can be varied by the additional circuit 24 will be described with reference to FIG. 3 in case of the additional circuit of a capacitance C.

In FIG. 3, a circle denoted by a reference C represents the capacitance C. The capacitance varies according to the position on the circle. The uppermost point of the circle corresponds to "$C=\infty$", that is, "electrodes short-circuited". As it goes clockwise from this point, the capacitance decreases within the positive range ($C>0$). The lowermost point of the circle corresponds to "$C=0$", that is, "electrodes open (disconnected)". As it further goes clockwise from this point to the above uppermost point, the absolute value of the capacitance increases within the negative range of the capacitance (C<0).

Here, it will be theoretically described that the modulus of elasticity can be varied by the additional circuit 24 (shunt impedance) between the electrodes. The basic expressions of piezoelectricity are given by the following (1) and (2).

$$S=s^E T+dE \quad (1),$$

$$D=dT+\epsilon^T E \quad (2),$$

where, S represents strain, $s^E$ does elastic compliance (the reciprocal of the modulus of elasticity) in a fixed electric field, T does stress, d does piezoelectric constant, E does electric field, D does electric displacement, and $\epsilon^T$ does dielectric constant in a fixed stress. The electromechanical coupling coefficient k is given by the following expression (3).

$$K^2=d^2/(s^E\epsilon^T) \quad (3).$$

When α is a value that the susceptance of an external element for making a shunt between the electrodes is normalized with the dielectric constant of the piezoelectric material, α=C/Cs (Cs: the capacitance of the piezoelectric material itself) and a condition of $D/E=-\alpha\epsilon^T$ . . . (4) is added. Short-circuiting the electrodes corresponds to "α=∞" and disconnecting the electrodes corresponds to "α=0". When D and E are eliminated from the expressions (1) and (2) with the expression (4) and the result is arranged with the expression (3), the following expression (5) is obtained.

$$S/T=s^E(1-k^2/(1+\alpha)) \quad (5).$$

The following expression (6) gives s(α) which is an elastic compliance (the reciprocal of the modulus of elasticity) when a shunt is made between the electrodes with the external element having the value of α.

$$s(\alpha)=S/T=s^E(1-k^2/(1+\alpha)) \quad (6).$$

The following expressions (7) to (10) are derived from the expression (6).

$$s(0)=s^E(1-k^2) \quad (7),$$

$$s(\infty)=s^E \quad (8),$$

$$s(-1)=\infty \quad (9),$$

$$s(-(1-k^2))=0 \quad (10).$$

As known from the expression (6), s(α) only varies from $s^E$ at the most to $(1-k^2)$ times of $s^E$ when α is within the range of "0<α<∞". When the variation range of α is extended to the negative region, however, s(α)can vary from 0 to ∞. When $-1<\alpha<-(1-k^2)$, s(α) becomes negative. In this manner, it becomes possible considerably to vary the modulus of elasticity of the piezoelectric material by varying the shunt impedance between the electrodes.

That is, in FIG. 3, as it goes clockwise from the state of "C=∞" (the uppermost point) to the state of "C"0 (the lowermost point), the piezoelectric material changes from so-called "soft state" to "hard state" in the elastic region and the modulus of elasticity of the piezoelectric material varies. When "$C=-(1-k^2)\cdot Cs$" where Cs represents the capacitance of the piezoelectric material itself, the expression (10) is satisfied and the modulus of elasticity (the reciprocal of s(α)) becomes "∞". The piezoelectric material then enters the negative elastic region (inertial region). After then, the expression (9) is satisfied and the modulus of elasticity becomes 0 when "C=−Cs". When the absolute value of the capacitance increases beyond this point, the piezoelectric material enters the elastic region again. In this manner, it becomes possible considerably to vary the modulus of elasticity by varying the capacitance C of the additional circuit. Moreover, it becomes also possible to make the modulus of elasticity negative.

Although a capacitance is added to vary the modulus of elasticity in the above description, it similarly becomes possible to vary the modulus of elasticity of the piezoelectric material in case of using a circuit of another element such as an inductance element or a resistance element, a circuit in which different elements are combined, or a circuit having an inductance function, a resistance function, a capacitance function or the like, as the additional circuit.

Figure 4C:
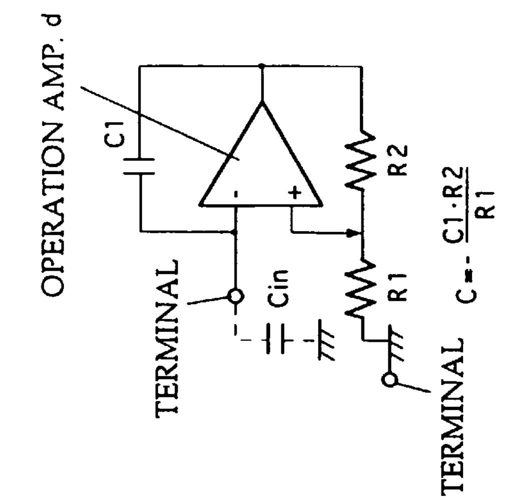
FIG. 4*c* is a circuit diagram of another additional circuit showing a negative capacitance.
Figure 4B:
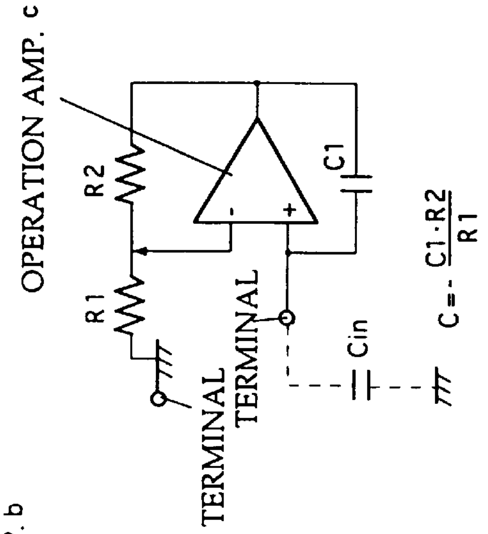
FIG. 4*b* is a circuit diagram of an additional circuit showing a negative capacitance.
Figure 4A:
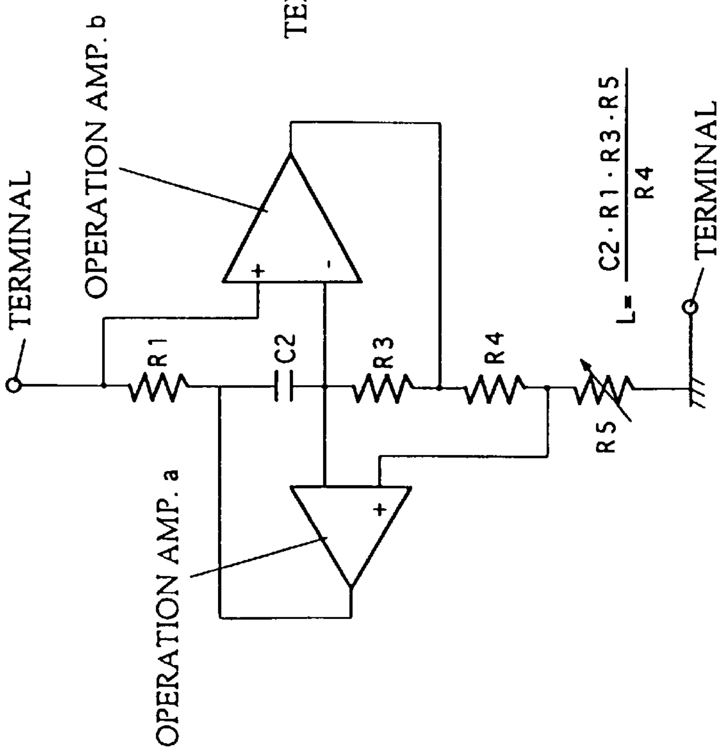
FIG. 4*a* is a circuit diagram of an additional circuit having an inductance function.

FIGS. 4*a* to 4*c* show circuit constructions for the additional circuit. A circuit having variable inductance and circuits showing negative capacitance will be described with reference to FIGS. 4*a* to 4*c*.

In FIG. 4*a*, a circuit between a pair of terminals which are respectively connected to the electrodes 22 has an inductance function (L). Of course, a single coil may be used as the additional circuit. In FIG. 4*a*, however, the inductance function in which a large value of inductance, for example, 1 MH is obtained is realized by an active circuit using operation amplifiers.

In the circuit shown in FIG. 4*a*, a resistance R1, a capacitor C2, and resistances R3, R4 and R5 are connected in series. The non-reverse terminal and the reverse terminal of an operation amplifier b which is connected to the not-shown electrodes are respectively connected to one end (on the side of a terminal) of the resistance R1 and the connecting point between the capacitor C2 and the resistance R3. The output terminal of the operation amplifier is connected to the connecting point between the resistances R3 and R4. In this case, the inductance L of this circuit is given by "L=(C2·R1·R3·R5/R4)". The inductance L can be varied because the resistance R5 is variable. The modulus of elasticity of the piezoelectric material can therefore be varied with good operability.

Circuits shown in FIGS. 4*b* and 4*c* show negative capacitance. One circuit shown in FIG. 4*b* is used when the absolute value of the capacitance C of the circuit is less than Cin which is the capacitance of a sample (|C|<Cin). The other circuit shown in FIG. 4*c* is used when the absolute value of the capacitance C of the circuit is more than Cin (|C|>Cin). The circuit shown in FIG. 4*b* includes a variable resistor comprising resistances R1 and R2, and an operation amplifier c (the power source of the operation amplifier c is not shown) to which a capacitor C1 is connected to make a positive feedback loop. The reverse terminal of the operation amplifier c is connected to the variable resistor. The circuit shown in FIG. 4*c* includes a variable resistor comprising resistances R1 and R2, and an operation amplifier d (the power source of the operation amplifier d is not shown) to which a capacitor C1 is connected to make a negative feedback loop. The reverse terminal of the operation amplifier d is connected to the variable resistor. In either of the circuits of FIGS. 4*b* and 4*c*, the capacitance C is given by "C=(C1·R2/R1)". As a result, the modulus of elasticity of the piezoelectric material can be varied with good operability in the manner that the variable resistor is controlled to vary the capacitance C. In this manner, it becomes possible considerably to vary the modulus of elasticity as shown in FIG. 3 by using any of the circuits shown in FIGS. 4a to 4c as the additional circuit 24 and varying the capacitance C of the additional circuit. Moreover, it becomes also possible to make the modulus of elasticity negative.

Figure 5:
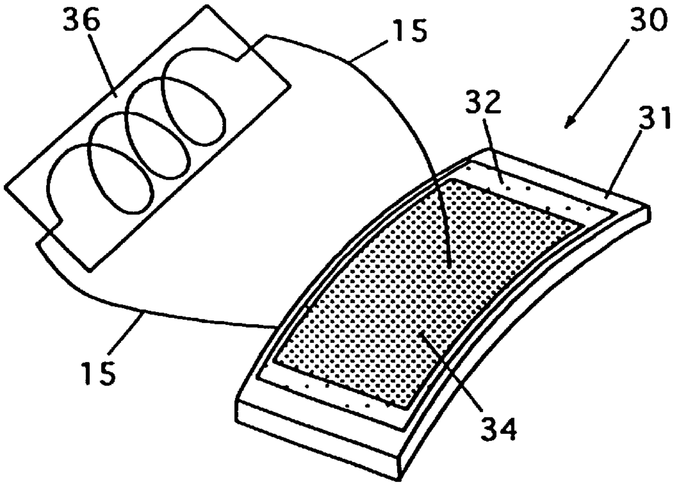
FIG. 5 is a view showing the construction of a variably sound-absorbing device according to the present invention.

FIG. 5 shows the construction of a variably sound-absorbing device according to the present invention. As shown in FIG. 5, the variably sound-absorbing device 30 according to the present invention comprises a piezoelectric material 32 the peripheral portion of which is fixed to a rigid frame 31, at least one pair of electrodes 34 formed on opposite surfaces (the upper and lower surfaces in the drawing) of the piezoelectric material 32, and at least one circuit element 36 through which the electrodes 34 are connected to each other.

As shown in FIG. 5, the piezoelectric material 32 constituting the variably sound-absorbing device 30 according to the present invention not only has the piezoelectric property but also is boardlike and curved. In this case, at least one surface of the boardlike piezoelectric material may be curved convexly or concavely. For example, the surface may be cylindrical or spherical or any other curved surface (a parabolic for example). The thickness of the boardlike piezoelectric material may be uneven. The curvatures of the outer and inner surfaces may differ from each other. All though FIG. 5 shows the rectangular piezoelectric material 32, the shape of the piezoelectric material 32 is optional and it may be circular as an example described later. The peripheral portion of the piezoelectric material 32 is preferably fixed to the frame 31 through the whole periphery but it may be fixed at a part of the periphery.

An electrical characteristic of the circuit element 36 is variable, and the modulus of elasticity (the real number part of the modulus of elasticity) and the loss factor (the imaginary number part of the modulus of elasticity) of the piezoelectric material can be varied thereby. As this circuit element 36, such a circuit showing a negative capacitance as illustrated in FIG. 4b or 4c is preferably used but such a circuit having variable inductance as illustrated in FIG. 4a may be used. Besides, this circuit element 36 may be such a capacitance C as illustrated in FIG. 3. A circuit of another element such as an inductance element or a resistance element, a circuit in which different elements are combined, or a circuit having an inductance function, a resistance function, a capacitance function or the like, may be used as this circuit element 36. The other construction of the device is the same as that of FIG. 2a.

Figure 6A:
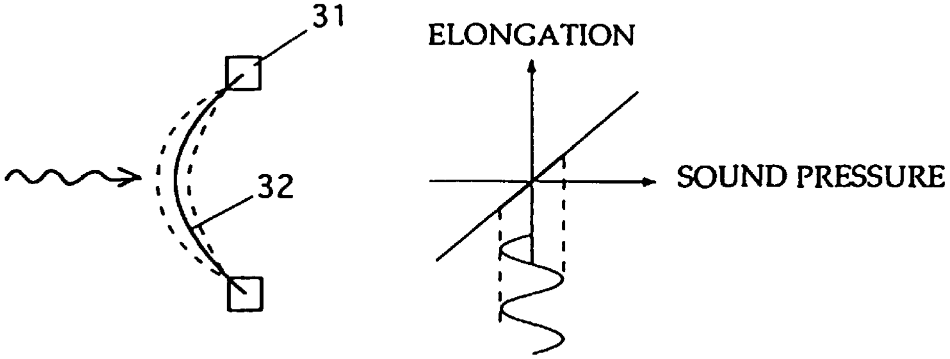
FIGS. 6*a* are a schematic illustration and a graph for explaining the basic principle of the present invention and FIGS. 6*b* are a schematic illustration and a graph in case that the piezoelectric material of FIG. 2 is fixed to a frame.
Figure 6B:
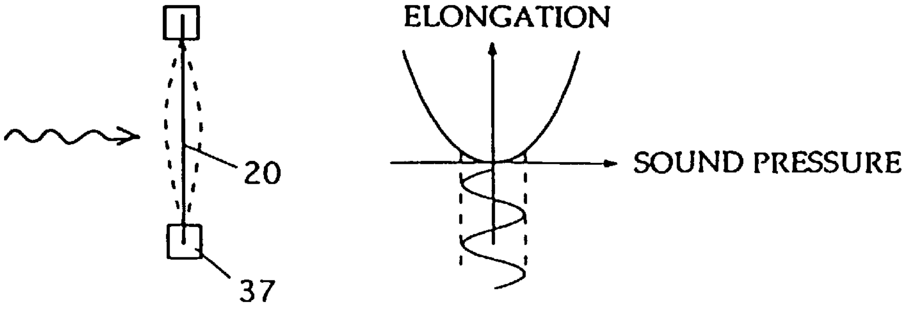

FIGS. 6a and 6b are for explaining the basic principle of the present invention. In these drawings, FIGS. 6a show a case of a piezoelectric material according to the present invention and FIGS. 6b show a case that such a piezoelectric material as shown in FIG. 2a is fixed to a frame.

When such a boardlike thin piezoelectric material 20 (a film for example) as shown in FIG. 2a is merely placed perpendicularly to a sound source, the whole of the material only vibrates evenly. A good sound-absorbing effect is not expected in case of a light film.

When the film 20 is stretched on a frame 37 as shown in FIGS. 6b, an elastic effect is expected at the natural frequency or less of the drum vibration of the film. But it is only by the primary elastic nature of the film and no increase in sound-absorbing characteristic with piezoelectric effect is expected. When the film is oscillated by sound pressure, a tensile force is applied to the film in either of cases that the film is drawn due to decrease in the pressure and the film is pushed due to increase in the pressure, as typically shown in the left figure of FIGS. 6b. In this case, the variation of the tensile force (that is, elongation) which causes a piezoelectric effect is in proportion to the square of the sound pressure. This means that the piezoelectric effect is decreased in a square manner because of the small amplitude of the sound pressure. For this reason, an expected effect of the piezoelectric connection is not obtained actually. On the contrary in a construction according to the present invention, the peripheral portion of the piezoelectric material 32 is fixed to the frame 31 and the piezoelectric material 32 is boardlike and curved as shown in FIGS. 6a. When the piezoelectric material 32 is expanded and contracted by sound pressure, the piezoelectric material 32 is oscillated as typically shown in the left figure of FIGS. 6a and a tensile force and a compressive force are alternately applied to the piezoelectric material. In this case, a tensile force in surface (elongation) is almost in proportion to the sound pressure as shown in the right figure of FIGS. 6a and the energy dispersion in the piezoelectric material increases in proportion to the sound energy. As a result, the attenuation of the sound energy can be increased independently of the magnitude of the sound.

Hereinafter, an example of a variably sound-absorbing device according to the present invention will be described.

FIGS. 7 show a part of a variably sound-absorbing device made on an experimental basis. FIG. 7a is a front view, FIG. 7b is a left side view and FIG. 7c is a top view. As shown in these drawings, a foamed polyurethane sheet 38, which was 2 cm thick and 10 cm wide, was shaped into a semicylindrical which was 2 cm thick at the center and 1 cm thick at the uppermost and lowermost ends. A piezoelectric film (PVFD) 32 on both surfaces of which electrodes 34 had been stuck was stuck on the curved surface of the semicylindrical foamed polyurethane 38. The thickness of the piezoelectric film 32 was about 20 □m.

FIG. 8 shows the whole structure of the variably sound-absorbing device. As shown in FIG. 8, a circuit element 36 was connected to the electrodes 34 on both surfaces of the piezoelectric film 32, and then the semicylindrical foamed polyurethane 38 was fitted in an end portion of a metal pipe 39, and then the opening of the end portion of the metal pipe 39 was closed with an end plate 40. After then, the acoustic absorptivity was measured by a well-known standing-wave pipe method in the manner that a sound wave of a predetermined frequency was introduced from the right in the drawing and the reflected sound was measured with a microphone 41.

In this experiment, an inductance was connected as the circuit element 36, and the resonance point was adjusted to 150, 200 or 250 Hz by, the piezoelectric film and the inductance.

Figure 9:
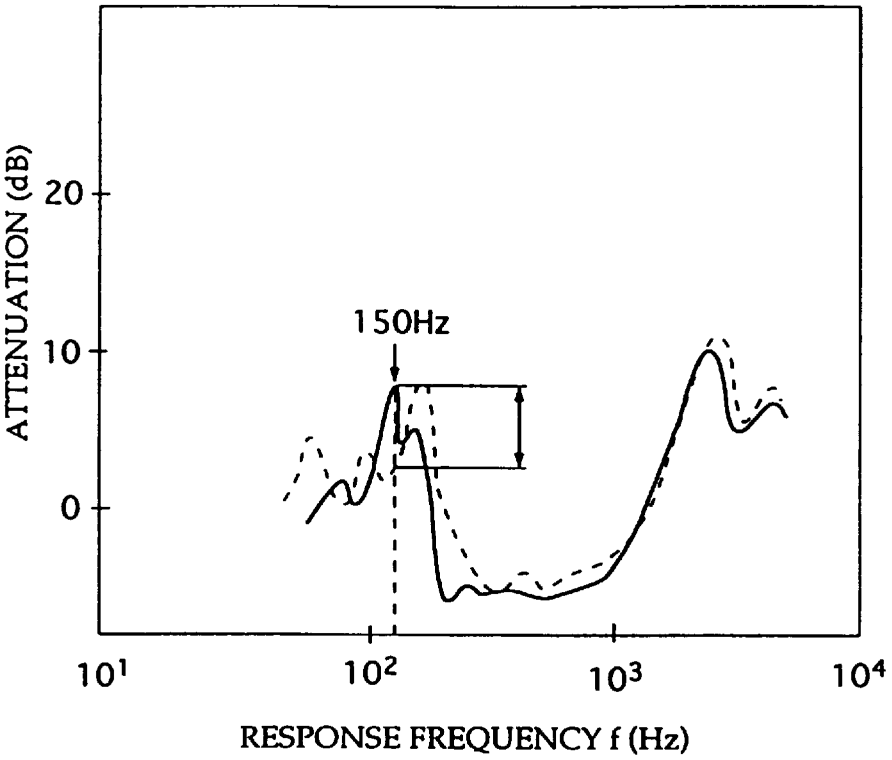
FIG. 9 is a graph showing an experimental result on the variably sound-absorbing device according to the present invention.
Figure 10:
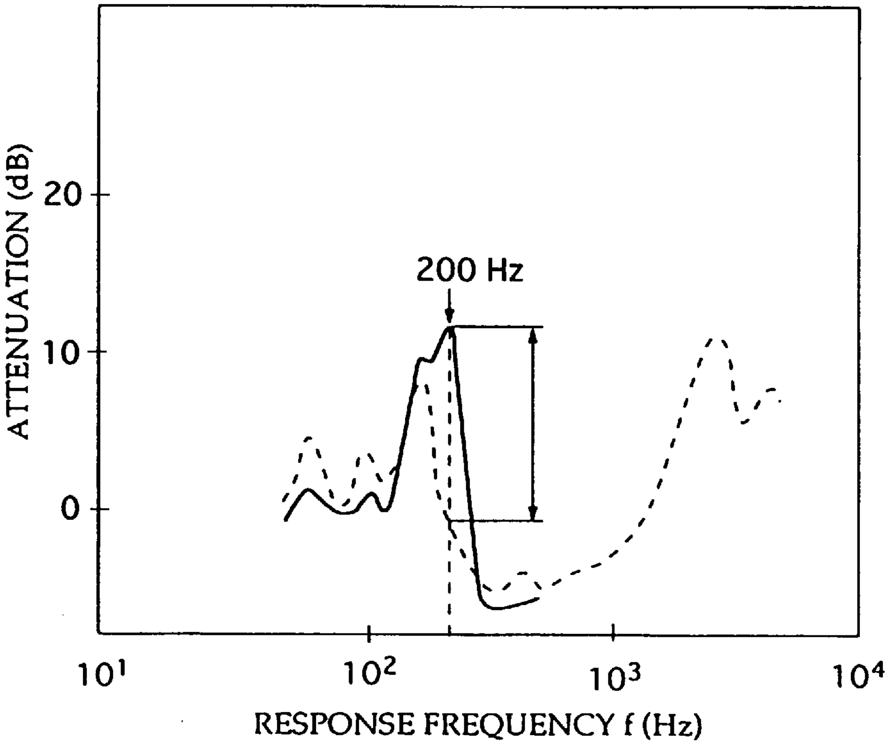
FIG. 10 is a graph showing another experimental result on the variably sound-absorbing device according to the present invention.
Figure 11:
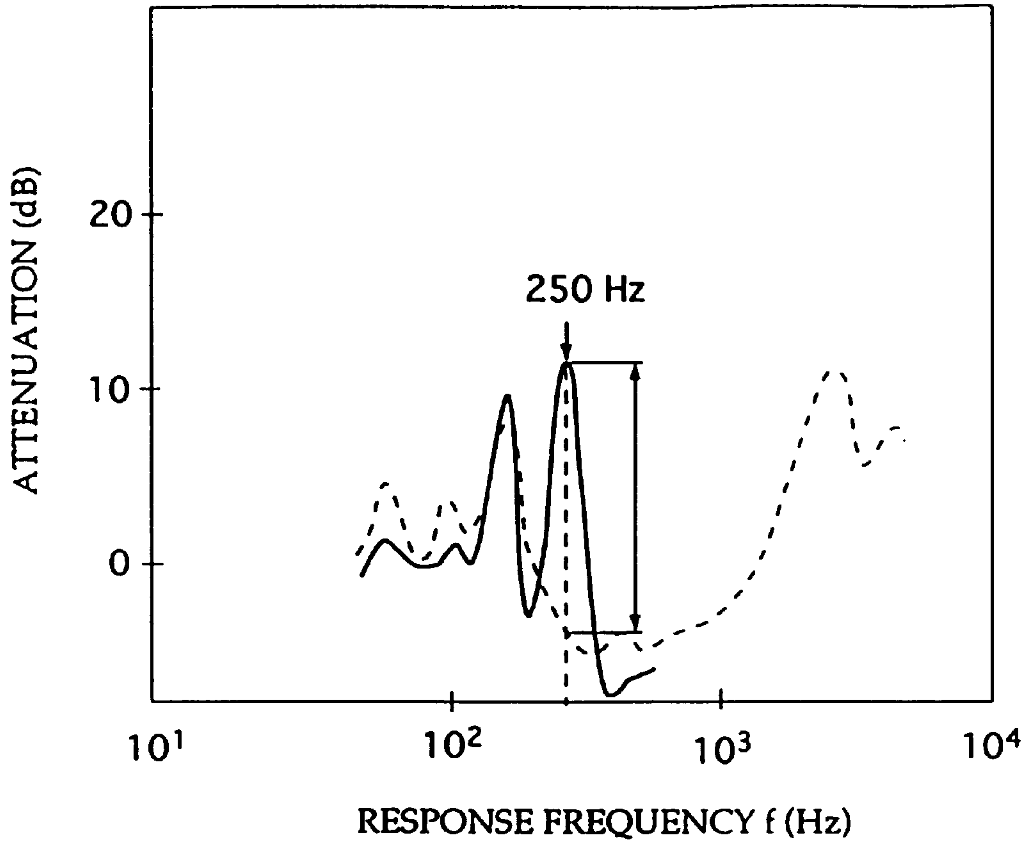
FIG. 11 is a graph showing still another experimental result on the variably sound-absorbing device according to the present invention.

FIGS. 9 to 11 show experimental results on the variably sound-absorbing device in the resonance points of 150, 200 and 250 Hz, respectively. In each of FIGS. 9 to 11, the horizontal axis represents response frequency (Hz), the vertical axis represents attenuation (dB), and a broken line shows a case that a piezoelectric film was merely stuck on a urethane body.

As shown by both-headed arrows in FIGS. 9 to 11, the attenuation (that is, the sound-absorbing quantities) shown by solid lines greatly exceed those shown by broken lines at the respectively adjusted resonance points. That is, the effect of increase in the acoustic absorptivity of 8 dB on the average and 12 dB at the maximum was obtained within the range of 100 to 500 Hz.

In each of FIGS. 9 to 11, it seems that a large absorption at several kHz is due to urethane itself. In case of connecting an inductance, it was found that the sound-absorbing characteristic becomes even in the high frequency region more than several kHz and there is almost no difference in the sound-absorbing characteristic in the low frequency region less than 100 Hz too.

When such a negative capacitance as illustrated in FIGS. 4*a* to 4*c* is added, the attenuation (the sound-absorbing quantity) can be increased still more.

As described above, in a variable sound-absorbing device according to the present invention, electrodes formed on both surfaces of a boardlike piezoelectric material are connected to each other through a circuit element an electrical characteristic of which is variable. The present invention thus brings about such outstanding effects as follows. The modulus of elasticity (the real number part of the modulus of elasticity) and the loss factor (the imaginary number part of the modulus of elasticity) of the piezoelectric material can be varied. Because the peripheral portion of the piezoelectric material is fixed and the piezoelectric material is boardlike and curved, a tensile force and a compressive force are alternately applied to the piezoelectric material when the piezoelectric material is expanded and contracted by sound pressure. As a result, the energy dispersion in the piezoelectric material increases in proportion to the sound energy and so the attenuation of the sound energy can be increased independently of the magnitude of the sound. The sound-absorbing characteristic can therefore be electrically varied to a considerable extent.

Although the invention has been described in its preferred form, it is to be understood that the scope of the right involved in the invention is not limited to the preferred form. The scope of the right of the invention therefore comprehends all changes, modifications and equivalents contained in the appended claims.

What is claimed is:

1. A variably sound-absorbing device comprising a piezoelectric material the peripheral portion of which is fixed, at least one pair of electrodes formed on opposite surfaces of said piezoelectric material, and at least one circuit element through which said electrodes are connected to each other, said piezoelectric material being boardlike and curved, said circuit element having a variable electrical characteristic to vary the modulus of elasticity (the real number part of the modulus of elasticity) and the loss factor (the imaginary number part of the modulus of elasticity) of said piezoelectric material.

2. A variably sound-absorbing device according to claim 1, wherein said circuit element shows a negative capacitance.

* * * * *